United States Patent [19]

Herrmann

[11] Patent Number: 4,952,819
[45] Date of Patent: Aug. 28, 1990

[54] CIRCUIT FOR LIMITING CURRENT PEAKS AT TURN-ON OF A SWITCHING TRANSISTOR

[75] Inventor: Dieter Herrmann, Büchenbach, Fed. Rep. of Germany

[73] Assignee: U.S. Philips Corporation, New York, N.Y.

[21] Appl. No.: 178,705

[22] Filed: Apr. 7, 1988

[30] Foreign Application Priority Data

Apr. 15, 1987 [DE] Fed. Rep. of Germany ....... 3712784

[51] Int. Cl.$^5$ .......................... H03K 3/30; H03K 3/01; H03K 17/687
[52] U.S. Cl. ..................................... 307/282; 307/270; 307/571; 307/296.1; 307/296.4; 307/296.5
[58] Field of Search ............... 307/282, 270, 253, 570, 307/571, 540, 542, 314, 566, 296.1, 296.4, 296.5

[56] References Cited

U.S. PATENT DOCUMENTS

| | | | |
|---|---|---|---|
| 3,463,938 | 8/1969 | McCoy | 307/253 |
| 3,571,614 | 3/1971 | Rolstead | 307/253 |
| 4,066,916 | 1/1978 | King et al. | 307/270 |
| 4,540,899 | 9/1985 | Pelly | 307/571 |
| 4,636,713 | 1/1987 | Stefani | 307/254 |
| 4,639,823 | 1/1987 | Kuroki | 361/159 |
| 4,700,083 | 10/1987 | Raets | 307/253 |
| 4,728,826 | 3/1988 | Einzinger et al. | 307/571 |

FOREIGN PATENT DOCUMENTS

3518913 11/1986 Fed. Rep. of Germany.

OTHER PUBLICATIONS

Gregorich et al, "Designing Switched-Mode Converters With a New Proportional Base Drive Technique", Proceedings of Powercon 5, Fifth National Solid State, Power Conversion Conference, San Francisco, CA., U.S.A. (May 4-6, 1978).

Primary Examiner—Stanley D. Miller
Assistant Examiner—Trong Quang Phan
Attorney, Agent, or Firm—Bernard Franzblau

[57] ABSTRACT

In a circuit arrangement for limiting the switching-on current peaks in a switching transistor (T), for example, a switching transistor in a direct voltage converter, rectangular switching pulses of the same height (UST) are applied to the control input of the switching transistor. In order to protect, for the largest possible number of types of application, the switching transistor (T) having an equally dimensioned coil (PW) from overload, the coil is included in a branch which is common both to the control circuit and to the operating circuit of the switching transistor. For simultaneously monitoring the operating current (I) in a direct voltage converter (UB, UA), the coil is the primary coil of a current transformer (STW), whose secondary circuit includes, inter alia, the series-combination of a saturable choke (DR) and a load resistor (RB2). The proportioning of all elements (RB1, DR, RB2, SW) in the secondary circuit of the current converter transformer can be chosen so that the voltage drop at the load resistor (RB2) is a measure of the current strength (i) through the switching transistor. When this voltage drop exceeds a threshold, the switching transistor is cut off by a pulse width modulator (PWM) until the next switching pulse occurs.

17 Claims, 1 Drawing Sheet

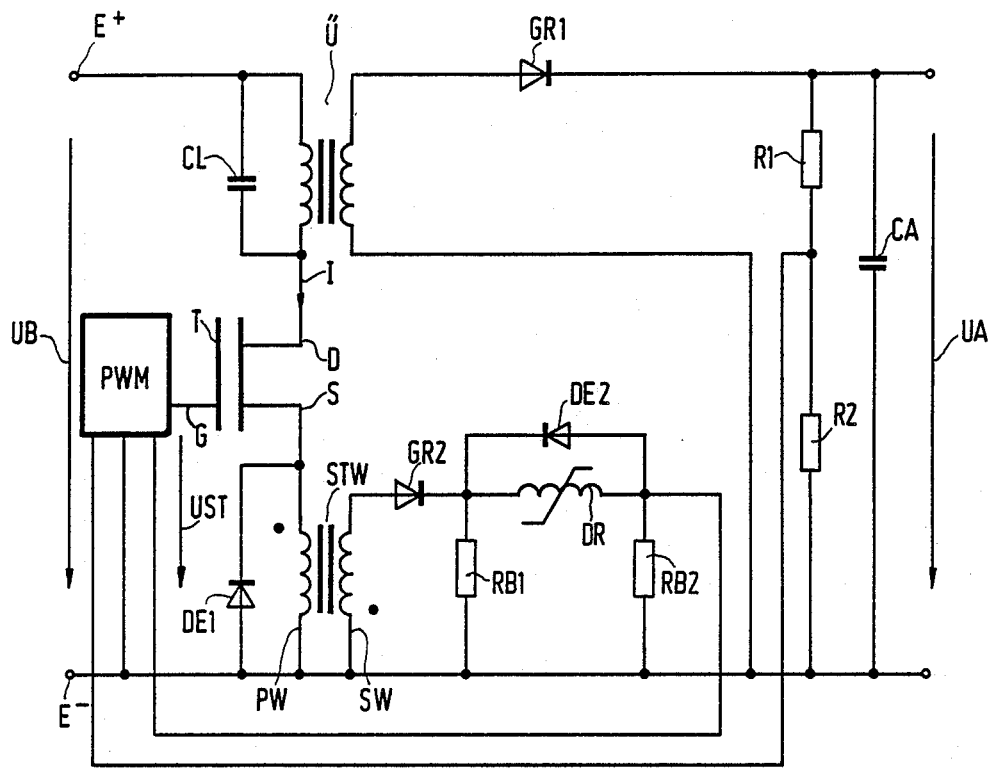

CIRCUIT FOR LIMITING CURRENT PEAKS AT TURN-ON OF A SWITCHING TRANSISTOR

BACKGROUND OF THE INVENTION

This invention relates to a circuit arrangement for limiting the switching-on current peaks in a switching transistor having a control input to which rectangular switching pulses of the same height are applied.

Such an arrangement is known, for example, from German Patent Application DE-35 18 913. The switching transistor—a field effect transistor—in the known arrangement is included in the primary circuit of a clocked direct voltage converter. A pulse width modulator controls the switching time of the field effect transistor in that it applies between the gate and source connections of the transistor rectangular switching pulses which vary in length. A saturable choke by which the switching-on current peaks are limited is arranged in series with the main current path of the switching transistor, i.e. in the drain supply lead.

When the transistor is switched to the conducting state, without the use of the saturable choke the overall input voltage drops across its drain-source path. Therefore, high current peaks (8 A and higher) occur and thus high power dissipations in the transistor are the result, which can lead to its destruction. The choke limits the current peaks and then reaches the saturated state so that the further behaviour of the converter during a switching pulse is not influenced thereby.

Since, however, the choke is arranged in the operating circuit of the transistor, at the switching-on instants of the transistor a voltage difference of the order of the input voltage of the direct voltage converter appears across this choke. The choke must therefore be dimensioned so that it is capable of withstanding, without damage, accidental voltage differences of the indicated order. Dependent upon the type of application, the input voltage of a direct voltage converter can lie at a few volts or at a few hundred volts. Therefore, the known protection circuit must be dimensioned anew for each type of application if it is not to be unnecessarily overdimensioned.

SUMMARY OF THE INVENTION

An object of the invention is to provide a circuit arrangement of the kind mentioned in the opening paragraph, which need not be dimensioned in accordance with the voltage conditions in the operating circuit of the switching transistor.

This object is achieved in that a coil is included in a connection lead of the switching transistor, which coil is traversed by the operating current of the switching transistor, in that the voltage produced by self-induction of this coil counteracts the control voltage of the switching transistor and in that the self-inductance of the coil is proportioned so that only the occurrence of switching-on current peaks leads to an effective reduction of the control voltage of the switching transistor.

When the coil is arranged in accordance with the invention, it need not have a magnetically saturable core. The maximum voltage differences that may occur between its connections are equally as large as the height of the switching pulses for the switching transistor so that its magnetic cross-section and its number of turns need only be dimensioned in accordance with this load. The number of turns can be chosen in all types of application to be so small that the winding capacitance of the coil is pratically zero.

Advantageous embodiments and a further improvement of the invention can be derived from the following description. In a further improvement of the invention, a circuit arrangement is provided by means of which the operating current through the switching transistor of a clocked direct voltage converter is monitored. In direct voltage converters having a high power transmission, the further improvement has the advantage that smaller losses occur than in monitoring circuits in which the operating current flows through an ohmic measuring resistor.

BRIEF DESCRIPTION OF THE DRAWING

In order that the invention may be readily carried out, it will now be described more fully, by way of example, with reference to the sole FIGURE of the accompanying drawing which shows a preferred embodiment of the invention.

DESCRIPTION OF THE PREFERRED EMBODIMENTS

The FIGURE shows the principle circuit diagram of a clocked direct voltage converter which employs the invention along with its further improvement.

The primary circuit of the direct voltage converter, to whose input E+, E−, an input voltage UB is applied, includes the parallel-combination of a capacitance CL and the primary coil of a transformer U as well as the main current path of a field effect transistor T, whose drain connection D is connected to the parallel-combination and whose source connection S is connected through a further coil PW to the negative terminal E− of the input voltage source. A demagnetization diode DE1 is connected in reverse direction parallel to the coil PW. A pulse width modulator PWM supplies the gate of the field effect transistor T with control pulses UST. The control voltage UST is applied between the gate connection G of the transistor and the negative terminal E− of the primary voltage source. When the transistor T is opened, the control voltage UST is 15 V, while, when it is closed, this voltage is zero V. The capacitance CL is the winding capacitance of the transformer U transformed to the primary side. The secondary circuit of the transformer U, which at the same time is the output circuit of the direct voltage converter, includes a first rectifier diode GR1 and an output capacitor CA, at which an output voltage UA is developed. A voltage divider R1, R2, whose centre tapping is connected to an input of the pulse width modulator PWM, is arranged parallel to the capacitor CA.

When the transistor T is cut off, the overall input voltage UB appears between its drain and source connections. When the transistor is opened, the capacitance CL acts, at the switching-on instant, as a shortcircuit so that the voltage UB now is applied between the drain connection D and the negative terminal E− of the input voltage source, i.e. appears across the series-combination of the low-ohmic drain-source path of the transistor T and of the coil PW.

A rapid increase of the current I is now also avoided by means of the coil PW, which need not have a saturable core, in that it reduces the gate-source voltage of the transistor T to substantially zero volt. Thus, the flow of the current through the transistor T is controlled so that at the ends of the coil PW a voltage difference larger than 15 V can never occur. Its inductance is solely to be proportioned so that the transistor T remains conducting in the operating range of the current I. The energy contained in the switching-on current peak of the current I is stored in the coil PW as magnetic energy and is converted into heat through the demagnetization diode DE1 when the current I decays.

It has not been taken into account in the explanation given thus far that the coil PW is the primary coil of a current converter STW. This fact is of no importance for the switching-on processes because the secondary coil of the current converter STW—as will be explained more fully below—has such a high ohmic value that the reaction of the secondary circuit on the primary circuit of the current converter STW is practically negligible.

The object of the secondary circuit of the current converter STW is to shorten, via the pulse width modulator PWM, the switching-on time of the transistor T when the current i, increasing at a substantially constant varying rate, exceeds a critical value. The pulse width modulator must remain uninfluenced by the processes described above at the switching-on instant.

For this reason, the series arrangement of a second rectifier diode GR2 and of a first load resistor RB1 (load) is connected between the connections of the secondary coil SW of the current transformer STW. The series arrangement of a choke DR and of a second load resistor RB2 is connected parallel to the first load resistor RB1. The choke DR is shunted by a second demagnetization diode DE2. The output connections of the secondary circuit correspond to the connections of the second load resistor RB2. The voltage present between these connections is applied to the current monitoring connections of the pulse width modulator PWM, which in the present example is the integrated element UC1846. The choke DR is saturable, that is to say that its core is made of a material which in operating conditions goes into magnetic saturation.

Now when the transistor T is switched into the conducting state, a voltage is developed across the connections of the secondary winding SW or across the load resistor RB1, which voltage initially has a peak starting at zero and then increases uniformly to a limit value. The resistance value of the load resistor RB1 is chosen so that the ratio of the variation in time of the voltage drop across it to the variation in time of the current i in the primary circuit of the direct voltage converter is analogous to a great extent. This analogy is utilized to immediately shorten the switching-on times of the transistor T when the voltage across the load resistor RB1, apart from the peak, exceeds a critical value. Use is made for this purpose of the voltage divider comprising the saturable choke DR and the second load resistor RB2, whose resistance value amounts approximately to one hundredth of the resistance value of the first load resistor RB1. The current flowing through this voltage divider increases with the voltage across the load resistor RB1, apart from a current peak suppressed by the choke DR. When the current through the choke DR has exceeded a threshold depending upon the dimensioning of the choke DR, it goes into magnetic saturation. This process leads to a more rapid current increase through the choke DR and hence to a more rapid voltage increase across the resistor RB2. The choke DR therefore acts as a current-dependent resistor; when it is not saturated, the overall load connected to the secondary coil SW is small, while, when it is saturated, the load is increased. The increased overall load results in that on the primary side of the current converter STW only its parasitic inductance is still active. This is particularly advantageous for the dimension of the inductance of the primary coil PW when high operating currents can flow. When the current I further increases, this is also the case for the current through the load resistor RB2 and hence for the voltage drop across it. When, finally, this voltage is applied at a threshold adjustable at the pulse width modulator PWM, the transistor T is cut off immediately until the next switching pulse occurs.

As already indicated, it should be ensured with the proportioning of the resistors RB1 and RB2 that the resistance value of the resistor RB1 is considerably larger (about a factor 100 larger) than that of the resistor RB2. Moreover, the resistance value of the resistor RB1 must also be large with respect to the ohmic resistance of the windings PW and SW in order that the above explanations of the operation of the coil PW hold good. At 15 V for the voltage UST, the current converter STW can be constructed so that the resistor RB1 has a value of a few hundred ohms and the resistor RB2 has a value of a few ohms.

What is claimed is:

1. A circuit arrangement for limiting switching-on current peaks in a switching transistor comprising: means for applying to a control input of the switching transistor a control voltage comprising rectangular switching pulses of the same height, characterized in that a connection lead of the switching transistor includes a coil through which an operating current of the switching transistor flows, in that a voltage produced by self-induction in said coil counteracts the control voltage of the switching transistor, and in that the self-inductance of the coil is proportioned so that only the occurrence of switching-on current peaks produces an effective reduction of the control voltage of the switching transistor.

2. A circuit arrangement as claimed in claim 1, further comprising a first demagnetization diode connected parallel to the coil.

3. A circuit arrangement as claimed in claim 2, characterized in that the coil is a primary coil of a current converter having a secondary circuit that includes a rectifier diode coupled to a load including a first resistor, and means connecting a series-combination of a saturable choke and a second load resistor in parallel with the first resistor, the resistance value of the first load resistor being considerably larger than the resistance value of the second load resistor.

4. A circuit arrangement as claimed in claim 3, characterized in that a second demagnetization diode is connected parallel to the saturable choke.

5. A circuit arrangement as claimed in claim 1, characterized in that the coil is a primary coil of a current converter having a secondary circuit that includes a rectifier diode coupled to a load including a first resistor, and means connecting a series-combination of a saturable choke and a second load resistor in parallel with the first resistor, the resistance value of the first load resistor being considerably larger than the resistance value of the second load resistor.

6. A circuit arrangement as claimed in claim 5 wherein said control voltage applying means comprises a pulse width modulator, said circuit arrangement further comprising means for supplying a voltage developed across said second resistor to a control input of the pulse width modulator so that the pulse width modulator cuts-off the switching transistor when said developed voltage exceeds a given threshold value.

7. A circuit for switching current in a load comprising:
a pair of input terminals for connection to a source of operating voltage for the circuit,
means connecting a load, a switching transistor and an inductor in series circuit across said input terminals such that a voltage produced by self-induction in the inductor counteracts a control voltage applied to a control electrode of the switching transistor, and
means for applying to said control electrode of the switching transistor a control voltage comprising uniform amplitude rectangular switching pulses that alternately drive the switching transistor into conduction and cut-off, and wherein
said inductor has a self-inductance value proportioned so that only current peaks produced during turn-on of the switching transistor develop a sufficient self-induction voltage in the inductor to produce an effective reduction of the control voltage of the switching transistor thereby to limit the amplitude of the current peaks developed during turn-on of the switching transistor.

8. A circuit as claimed in claim 7 wherein said load comprises a transformer having a primary winding connected in said series circuit and a secondary winding coupled to load terminals via a current rectifier.

9. A circuit as claimed in claim 8 wherein said control voltage applying means comprises a pulse width modulator having a control input responsive to a voltage developed at said load terminals.

10. A circuit as claimed in claim 7 wherein said switching transistor comprises a field effect transistor with the inductor connected between a source electrode of the field effect transistor and one of said input terminals and a demagnetizing diode connected in parallel with said inductor.

11. A circuit as claimed in claim 10 wherein said load includes an inductive element and said series circuit includes the inductive element, the switching transistor, and the inductor connected in the order named across said input terminals.

12. A circuit as claimed in claim 7 wherein said inductor is a primary winding of a transformer having a secondary winding, means connecting a diode and a first resistor in series across said secondary winding, means connecting a saturable reactor and a second resistor in a series-combination across the first resistor, wherein the resistance value of the first resistor is much larger than the resistance value of the second resistor.

13. A circuit as claimed in claim 12 wherein said control voltage applying means comprises a pulse width modulator having a control input responsive to a voltage developed across said second resistor, said circuit further comprising a demagnetizing diode connected in parallel with the saturable reactor.

14. A circuit as claimed in claim 7, wherein said inductor is connected in a circuit branch that is common to the main current path of the switching transistor and to a control circuit of the switching transistor which control circuit includes the control electrode and that one main electrode of the switching transistor which is remote from said load.

15. A circuit for switching current in a load comprising:
a switching transistor having a control electrode and having first and second main electrodes which define an operating circuit through which an operating current of the switching transistor flows,
means for coupling a load to one main electrode of the switching transistor,
a control circuit coupled to said control electrode and to said second main electrode of the switching transistor for applying to said control electrode a control voltage comprising rectangular switching pulses,
an inductor coupled to said second main electrode of the switching transistor in a manner such that the inductor is included in a circuit branch that is common to the control circuit and to the operating circuit of the switching transistor whereby a self-induction voltage produced in the inductor counteracts the control voltage applied to said control electrode of the switching transistor, the inductance of said inductor being chosen so that only current peaks produced by turn-on of the switching transistor develop a sufficient self-induction voltage in the inductor to produce an effective reduction of the control voltage of the switching transistor thereby to limit the amplitude of the current peaks developed by turn-on of the switching transistor.

16. A circuit as claimed in claim 15 wherein said inductor is a primary winding of a transformer having a secondary winding,
means connecting a diode, a resistor and a saturable reactor to said secondary winding to form a transformer secondary circuit that develops a voltage indicative of the operating current in the switching transistor, and
said control circuit includes a pulse width modulator controlled by the voltage developed in said secondary circuit.

17. A circuit as claimed in claim 16 wherein said secondary circuit further comprises a demagnetizing diode connected in parallel with the saturable reactor.

* * * * *